United States Patent [19]

Birgenbeier et al.

[11] Patent Number: 5,001,724

[45] Date of Patent: Mar. 19, 1991

[54] METHOD AND APPARATUS FOR MEASURING PHASE ACCURACY AND AMPLITUDE PROFILE OF A CONTINUOUS-PHASE-MODULATED SIGNAL

[75] Inventors: Raymond A. Birgenheier; Richard P. Ryan, both of Spokane, Wash.

[73] Assignee: Hewlett-Packard Company, Palo Alto, Calif.

[21] Appl. No.: 297,357

[22] Filed: Jan. 13, 1989

[51] Int. Cl.⁵ .................... H04B 17/00; H04L 7/033
[52] U.S. Cl. .................................... 375/10; 329/304; 375/118; 455/226
[58] Field of Search .................... 375/10, 118, 94, 102, 375/83, 90, 39, 77, 47; 329/304; 455/226

[56] References Cited

U.S. PATENT DOCUMENTS

| | | | |
|---|---|---|---|
| 4,027,250 | 5/1977 | Lang | 375/39 |
| 4,513,428 | 4/1985 | Roeder | 375/77 |
| 4,514,855 | 4/1985 | Lang et al. | 375/118 |

Primary Examiner—Douglas W. Olms
Assistant Examiner—Marianne Huseman

[57] ABSTRACT

A method and apparatus for determining the phase and amplitude accuracy of continuous-phase-modulated signals is described. A modulated RF signal generated by a transmitter is down converted to a relatively low intermediate frequency which is filtered and sampled by a high sampling rate analog-to-digital convertor. A digital signal processor processes the digital signals to produce a measured amplitude function and a measured phase function corresponding to the modulated RF signal. From the measured amplitude and phase functions, an ideal phase function corresponding to the modulated RF signal is calculated and synthesized. The ideal phase function is compared to the measured phase function to determine the phase function from which the modulated RF signal phase error and frequency error are computed.

18 Claims, 10 Drawing Sheets

METHOD AND APPARATUS FOR MEASURING PHASE ACCURACY AND AMPLITUDE PROFILE OF A CONTINUOUS-PHASE-MODULATED SIGNAL

BACKGROUND AND SUMMARY OF THE INVENTION

The present invention relates generally to digital radios and, more specifically, to measuring the phase and amplitude errors in a continuous-phase-modulated signal.

Presently a number of manufacturers manufacture and market radios for use in communications, such as digital cellular radios and the like. Typically each manufacturer provides its own specifications for its products. Traditionally the accuracy of these specifications has been measured using many separate, possibly indirect methods. Phase accuracy of the transmitted signal, for example, typically is indirectly determined by measuring spurious signals, phase noise, the modulation index, frequency settling speed, carrier frequency and data clock frequency. Further, amplitude measurements present special problems because the amplitude versus time profile must be synchronized to the data typically utilizing external equipment.

It has been proposed that a standardized mobile digital radio system be implemented throughout Europe. Such a radio system would require that all components such as transmitters and receivers for example, be manufactured to standard specifications measured by a common method. A group known as the Group Speciale Mobile (GSM) has proposed a measurement technique to measure the accuracy of the modulation process of the transmitted signal. In the proposed measurement technique, a sampled measurement of the transmitted phase trajectory is obtained. This measurement is compared with the mathematically computed ideal phase trajectory to determine the phase difference between the transmitted signal and the ideal signal. The regression line of the phase difference thus determined provides an indication of the frequency error and the regression line is subtracted from the phase difference to give the phase error. Utilization of a standard method such as this would simplify the testing and manufacture of radios. An individual manufacturer would then only need to insure that the standardized overall phase error specifications were met rather than several interrelated specifications.

SUMMARY OF THE INVENTION

The present invention provides a method and apparatus for computing the ideal phase trajectory of a transmitted signal to be used in the above described GSM standard phase error measurement method. According to the principles of the present invention a transmitted signal is mixed with a local oscillator signal to provide an intermediate frequency (IF) signal having a relatively low frequency which is then filtered and sampled by an analog-to-digital convertor (ADC). The digitized samples of the IF signal are then filtered in a digital low pass filter, such as a linear-phase finite impulse response (FIR) filter to eliminate the IF signal harmonics without distorting the phase modulation of the transmitted signal. An FIR digital filter is less complex and less expensive than an equivalent analog filter required to perform this filtering operation.

The transmitted signal phase trajectory and amplitude profile are calculated from the filtered IF signal samples. A Hilbert transformer is utilized to create two component signals that are in phase-quadrature with each other. The signal phase trajectory is provided by calculating the arctangent of the quadrature signals and the amplitude is calculated as the square root of the sum of the squares of the quadrature signals.

The signal phase trajectory is then utilized to detect the data and determine the data clock phase. Detection of the data could be accomplished utilizing a Viterbi decoder or, in the case of a high signal-to-noise ratio (SNR) and low inter-symbol-interference (ISI) signal, by differentiating the phase trajectory. Differentiation of the phase trajectory provides the instantaneous frequency of the signal from which the carrier frequency may be subtracted to provide the frequency deviation of the signal. The instants of time at which the frequency deviation passes through zero are then used in a least squares algorithm to estimate the data clock phase. An accurate estimation of the data clock is critical to the measurement of phase errors.

The zero crossing of the frequency deviation function are also used to detect the data. Synchronization of the data is accomplished utilizing a correlation scheme between the detected data and a known portion of the data sequence such as a preamble. The synchronization information is then used to find the time interval of interest in the measurement operation. The synchronization information is also used to synchronize the amplitude versus time profile with the data clock.

Utilizing the data clock phase, the detected data sequence and the time interval of interest, a digital signal synthesizer mathematically generates the ideal phase trajectory corresponding in the transmitted signal. The ideal phase trajectory thus generated is subtracted from the previously measured phase trajectory of the transmitted signal to provide a signal phase difference versus time measurement. A linear regression analysis performed on the phase difference versus time measurement provides an estimate of the frequency error as well as the instantaneous phase error.

DETAILED DESCRIPTION OF THE PREFERRED EMBODIMENTS

Figure 1:
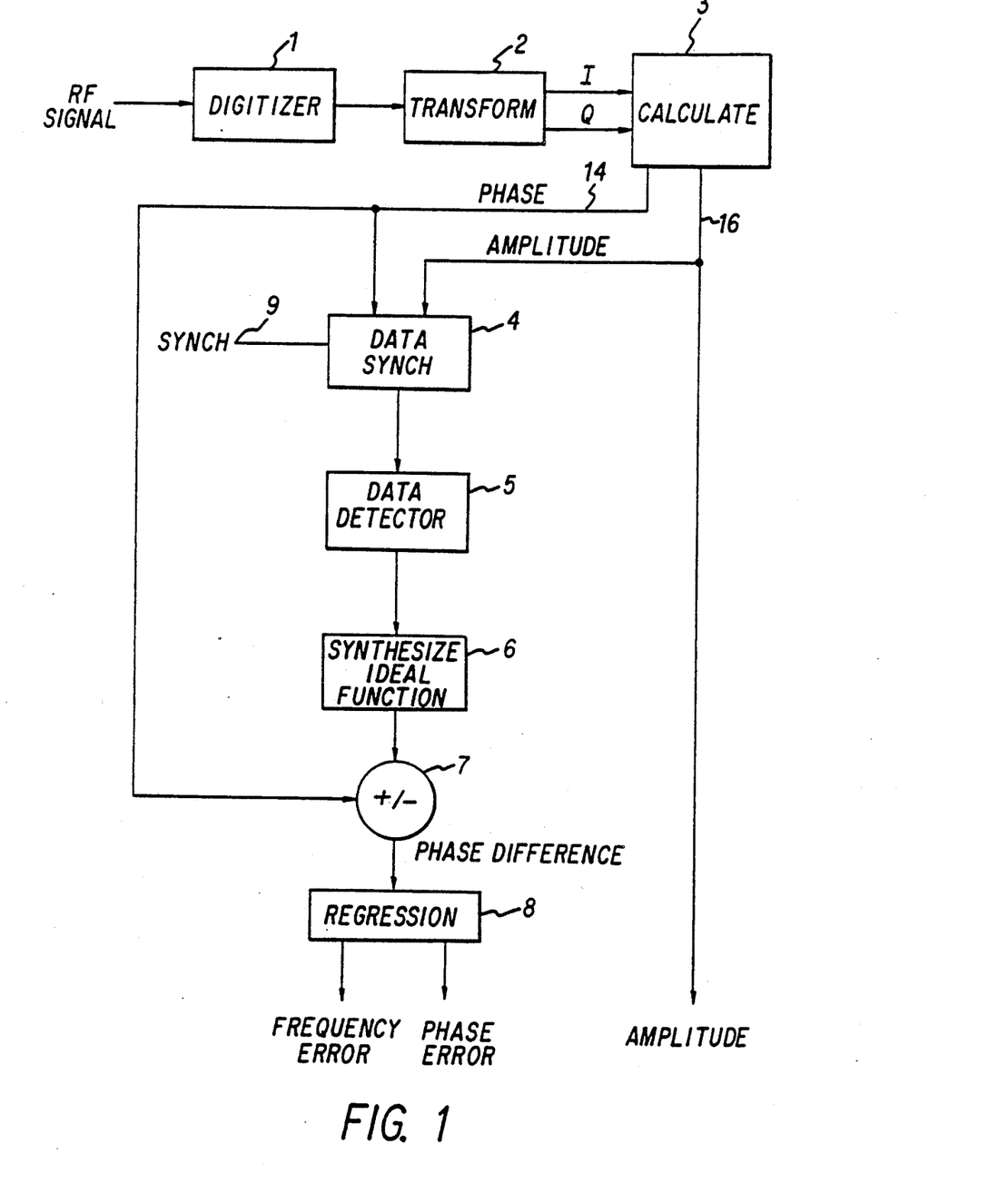
FIG. 1 is a flow chart illustrating a first embodiment of a method for measuring the phase error of a transmitted signal according to the principles of the present invention.
Figures 4, 5:
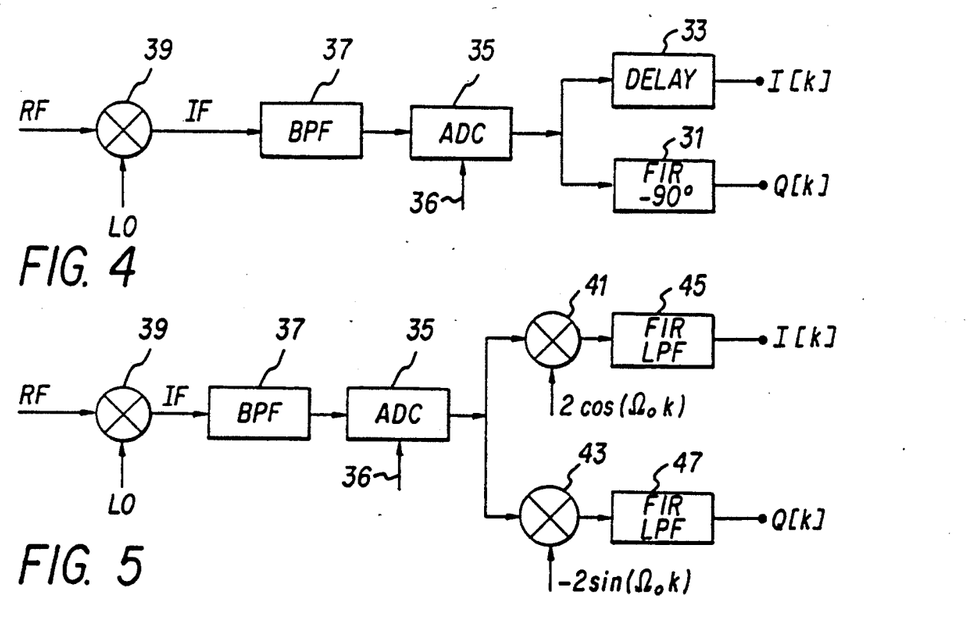
FIGS. 4, 5 and 6 are functional block diagrams illustrating three different techniques for converting an IF signal to in-phase and quadrature-phase signals.
Figure 6:
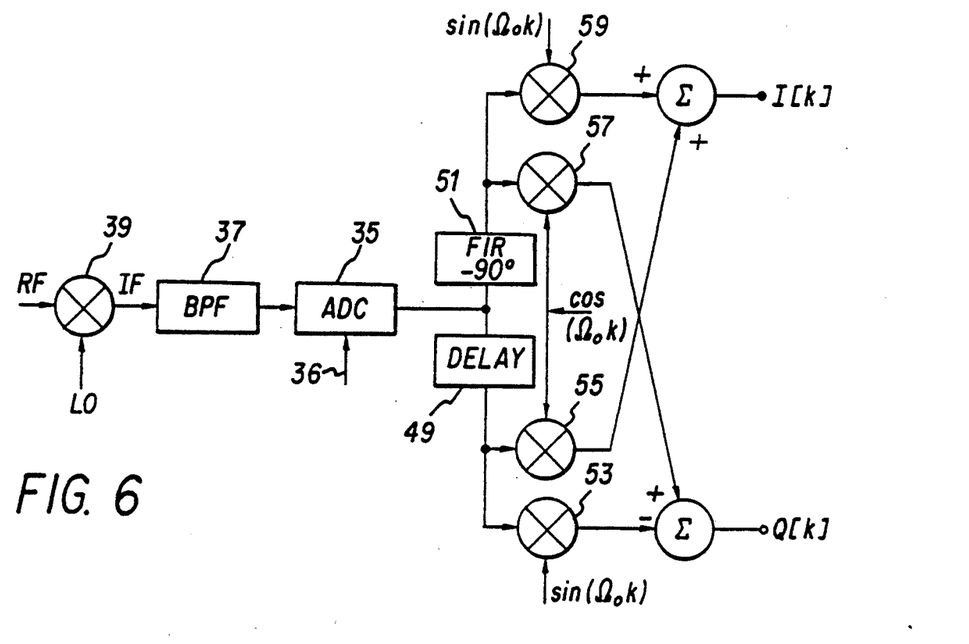
Figure 10:
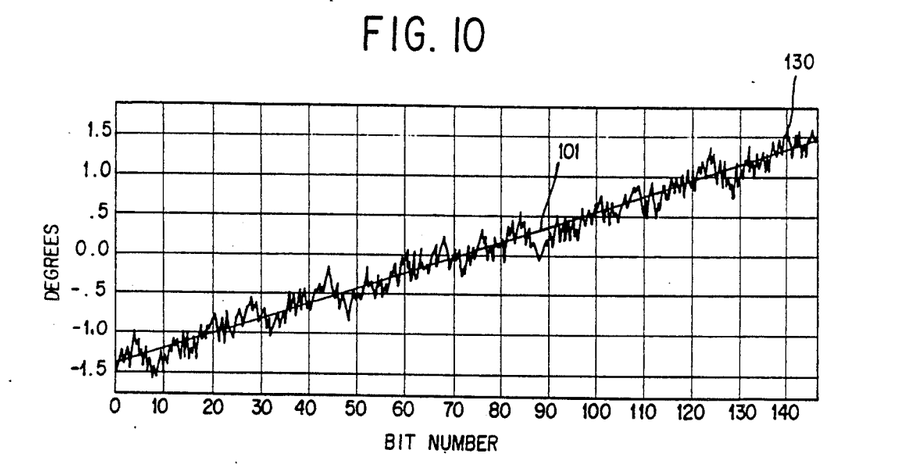
FIG. 10 is a plot showing the instantaneous phase difference and linear regression curve.

Referring now to FIG. 1, a flow chart illustrating a first preferred embodiment of a method for measuring the phase error of a continuous-phase-modulated RF signal is shown. A modulated RF signal generated by a transmitter is received and converted to digital form by a digitizer circuit 1. The digitized signal is then converted or transformed into its component in-phase and quadrature-phase signals by a transformation circuit (such as shown in FIGS. 4, 5 and 6) and the transmitted signal amplitude and phase functions are computed by a calculator 3 from the component signals. Utilizing a known synchronization signal 9, which may comprise a known sequence of data bits, a preamble or midamble for example, the bit sequence representing the transmitted data is synchronized, block 4 from the phase and amplitude functions to provide the transmitter data clock and a test data interval. A data detector 5 detects the data bit sequence and provides the three signals, transmitter data clock, test data interval and the data bit sequence to a synthesizer block 7 to synthesize or mathematically calculate an ideal phase function corresponding to the transmitted signal. The data detector 5 may be implemented as a maximum likelihood sequence estimator utilizing the Viterbi algorithm. The measured phase function (i.e., the transmitted signal phase) is subtracted from the ideal phase function thus synthesized in block 7 to provide a phase difference. A linear regression in block 8 of the phase difference then provides the frequency error, the slope of the regression line 101, and the phase error, curve 102 (as shown in FIG. 10).

Figure 2:
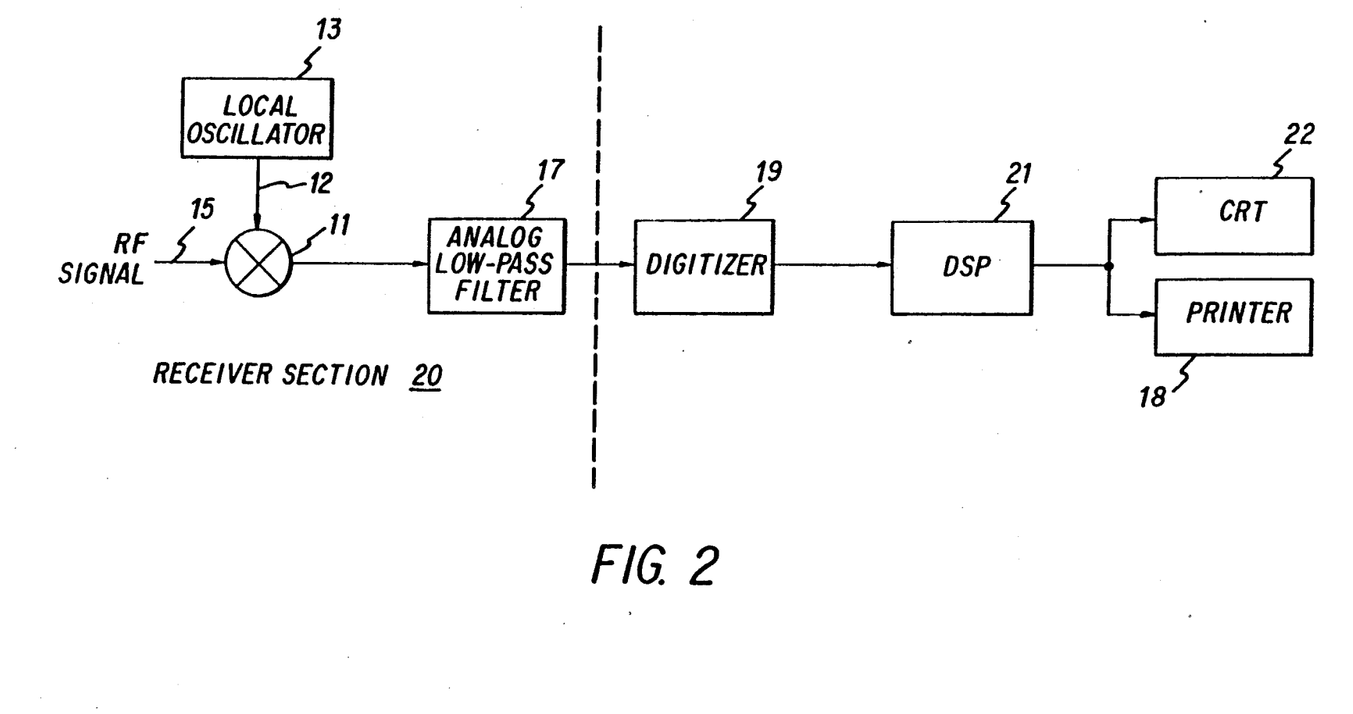
FIG. 2 is a conceptual block diagram of an apparatus for measuring the phase error of a transmitted signal according to the method shown in FIG. 1.

Referring now to FIG. 2, a conceptual block diagram of an apparatus for measuring the phase error and phase amplitude of a continuous-phase-modulated RF signal is shown. The modulated RF signal is received by a receiver 20 and coupled to a down conversion mixer circuit 11. This mixer circuit receives a local oscillator signal on line 12 generated by the local oscillator 13 and a test signal on line 15 to provide an intermediate frequency (IF) signal having a substantially lower frequency than that of the test signal, in the present embodiment the IF frequency is preferably 700 KHz. The IF signal is filtered in an analog anti-aliasing filter 17 to remove local oscillator and RF signal feed through and spurious signals. The filtered IF signal is coupled to a digitizer 19 to convert the analog IF signal to a discrete-time data sequence at a high sample rate, preferable at 2.8 million samples per second (Msps). An HP70700A digitizer manufactured by Hewlett-Packard Company may be used for this purpose or the digitizer 19 may be implemented by an ADC sampling at a high rate as shown in FIGS. 4, 5 and 6. After conversion to an IF signal having a frequency of approximately 700 KHz, the test signal test can be represented as $$y(t) = A(t)\cos[(\omega_0 + \Delta\phi)t + \phi(t;\underline{a}) + \phi_0] \quad (1)$$

where:

A(t) is the received signal amplitude;

$\omega_0 = 2\pi(700\ \text{KHz})$ is the nominal IF signal frequency;

$\Delta\omega$ is the frequency uncertainty;

$\phi(t;\underline{a})$ is the received signal phase modulation function;

and $\phi_0$ is an unknown offset phase.

As given here only $\phi(t;\underline{a})$ is a function of the data sequence $\underline{a}$; however, in general A(t) may also be a function of $\underline{a}$.

A transmitted RF signal or the IF signal down converted from the RF transmitted signal defined by equation (1) typically will be received in bursts having a duty cycle of 0.125 and being approximately 0.5 milliseconds (ms) in duration.

A(t) and $\phi(t;\underline{a})$ are, respectively, the amplitude modulation and phase modulation of the received signal (i.e., the transmitted signal) which will be different than the ideal modulation of the transmitted signal. The present method determines the difference between the values of the received signal functions A(t) and $\phi(t;\underline{a})$ and the ideal values of these functions.

The digitizer 19 converts the IF signal defined by equation (1) to a sequence of discrete time samples. If the sampling points are given as $t = kT_S$, $k = 0, 1, 2, \ldots$ where $T_S$ is the time period between samples, and if we define $\Omega_0 = \omega_0 T_S$ and $\Delta\Omega = \omega T_S$, then the sequence of samples can be written as $$y[k] = A[k]\cos[(\Omega_0 + \Delta\Omega)k + \phi(k;\underline{a}) + \phi_0] \quad (2)$$

$$k = 0, 1, 2, \ldots.$$

Quantized values of equation (2) provide the sequence of binary numbers coupled to the digital signal processor 21 for implementation of the present method.

Figure 11:
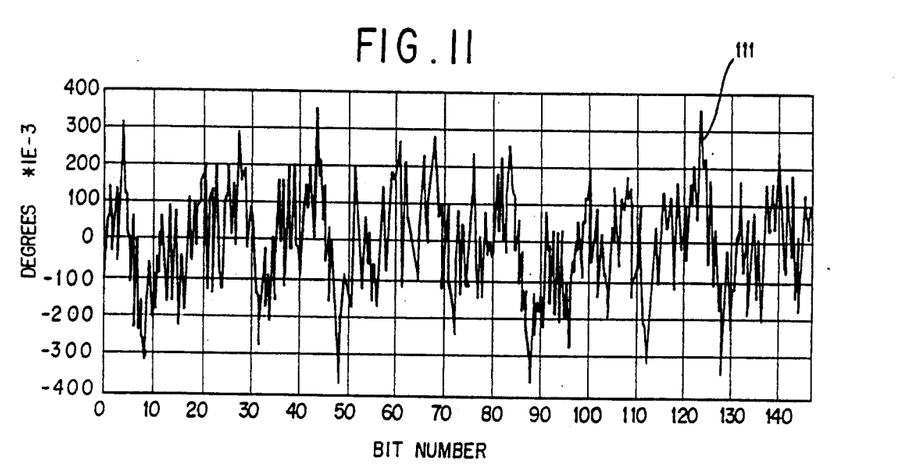
FIG. 11 is a plot showing instantaneous measured phase error versus bit number.
Figure 12:
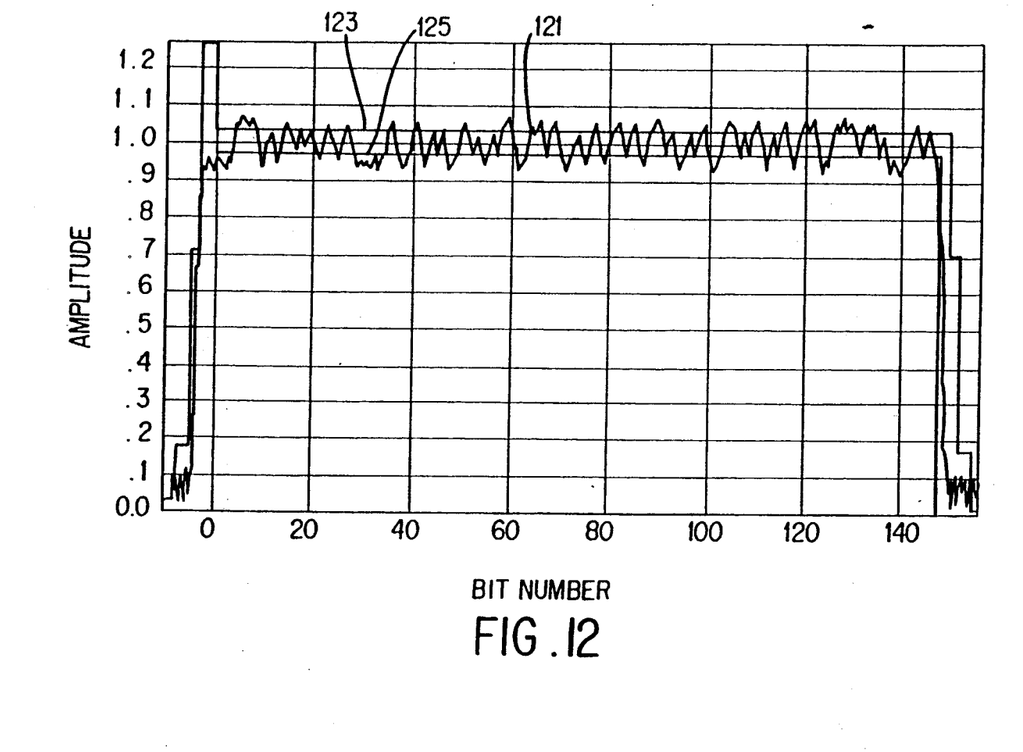
FIG. 12 is a plot showing measured pulse amplitude.
Figure 13:
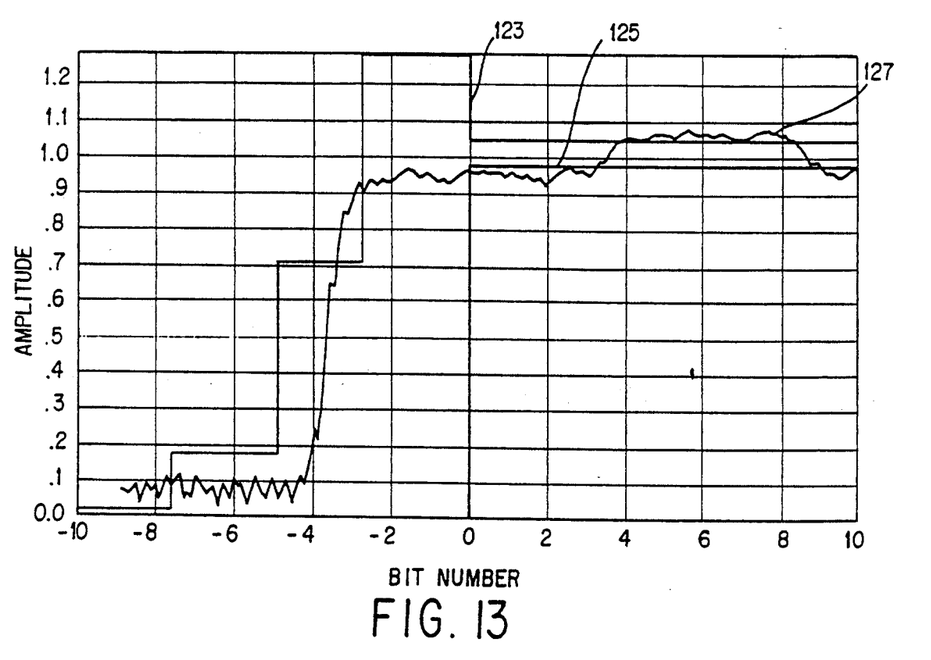
FIG. 13 is a plot showing an expanded view of the rise time of the pulse shown in FIG. 12.
Figure 14:
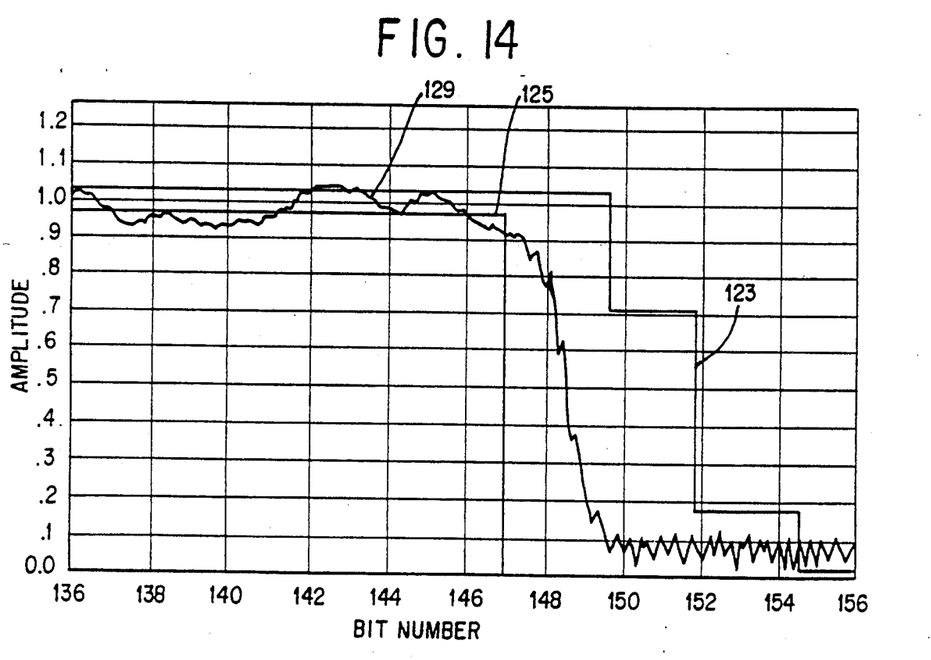
FIG. 14 is a plot showing an expanded view of the fall time of the pulse shown in FIG. 12.

The outputs of the digital signal processor 21, phase error, frequency error and the amplitude profile are coupled to various display means, such as a cathode ray tube (CRT) 22 and a printer 18. The display means include the required circuity to format the display of the information provided by the digital signal processor 21. Typically, the phase, frequency and amplitude information are plotted versus time with the time interval defined by the number of data bits contained in a transmitted signal burst. FIGS. 10 and 11 are examples of phase difference and frequency error and phase error plots while FIGS. 12, 13 and 14 are plots of the transmitted signal amplitude profile.

Figure 3:
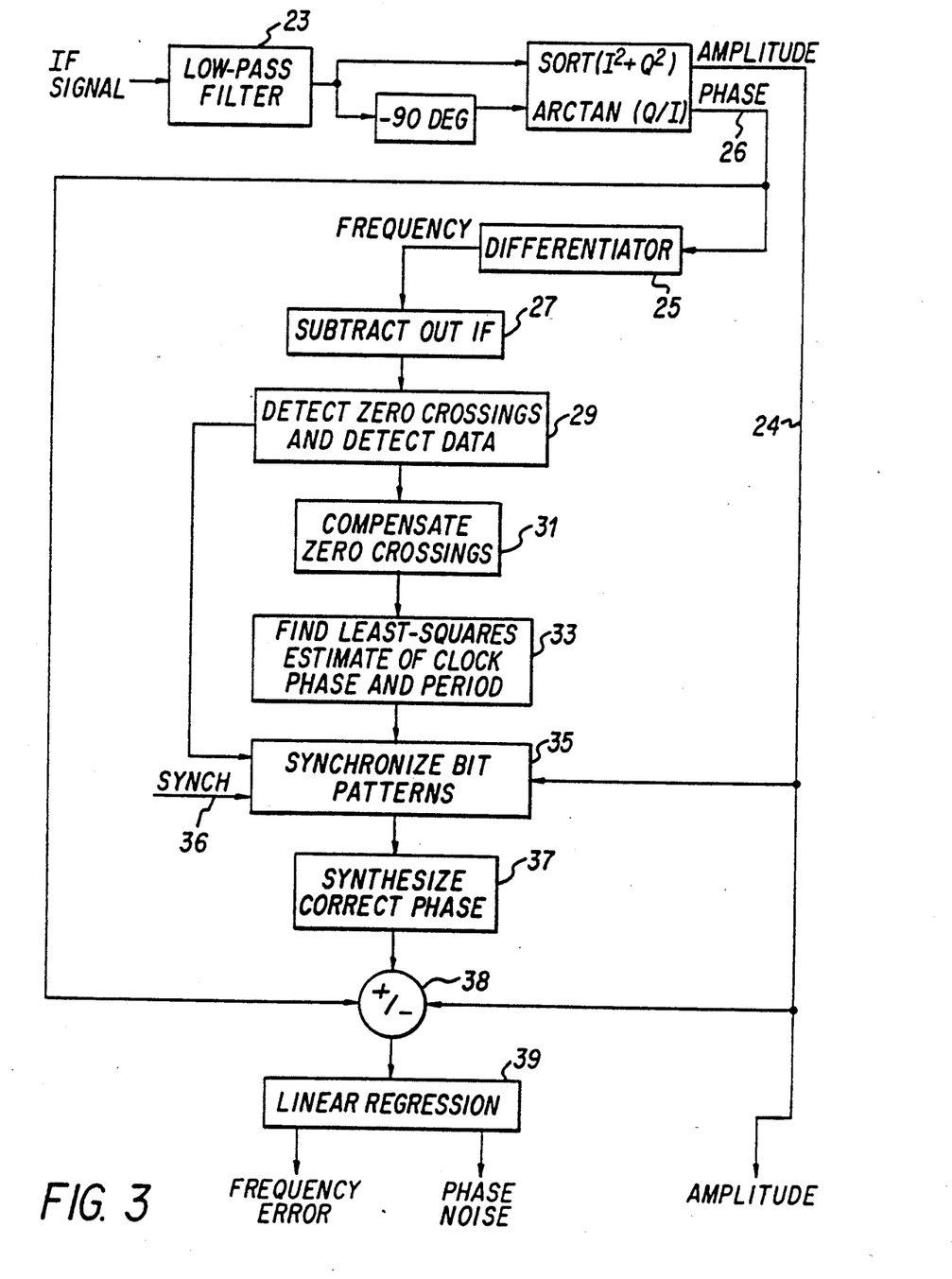
FIG. 3 is a flow chart of a method for measuring the received amplitude and the phase error of a transmitted signal according to the principles of the present invention.

FIG. 3 is a flow chart illustrating a second preferred embodiment of the method according to the principles of the present invention for determining the received RF signal amplitude, A[k], and the difference between the measured phase modulation, $\phi(k;\underline{a})$, of the received RF signal and the ideal phase modulation, $\phi(k;\underline{a})$. The modulation functions have been discretized by replacing "t" with $kT_S$, $k = 0, 1, 2, \ldots.$ The first step in the flow diagram is to pass the digital IF samples through a low-pass digital filter 23. The low-pass digital filter 23 would preferably be a finite impulse response (FIR) filter that would have a linear phase response to avoid distortion of the phase modulation of the signal passed by the filter 23. The purpose of the low-pass filter 23 is to eliminate the harmonics of the 700 kHz IF signal. An FIR digital filter can perform this job with relative ease and with less cost than an analog filter which otherwise would be required.

After the initial low-pass filtering, the signal is converted to two component signals that are in phase quadrature with each other. Three different techniques are proposed as possible methods for producing the quadrature signals.

Referring now to FIG. 4, a first method of conversion to in-phase, I[k], and quadrature-phase, Q[k], (I-Q conversion) signals utilizes a Hilbert transformer 31. An RF signal is down converted to an IF signal by mixing with a local oscillator signal in mixer 39. The resulting IF signal is coupled to an ADC 35 via band pass filter 37. The filtered IF signal is converted to a digital signal by a high-sampling rate ADC 35 which is clocked by the sample signal on line 36. The Hilbert transformer 31 comprises a filter with a constant magnitude response and a phase response of −90 degrees for positive frequencies and +90 degrees for negative frequencies. An approximation to the Hilbert transformer 31 can be realized with a anti-symmetric FIR filter 31 that has an ideal phase response and an amplitude response that is nearly ideal over the range of frequencies of the signal. Delay line 33 compensates the in-phase signal for time delays introduced into the quadrature-phase signal by the FIR filter 31.

Referring now to FIG. 5, a second method of I-Q signal decomposition involves mixing the digitized IF signal with quadrature signals at mixers 41 and 43 and passing the low-frequency components through low-pass filter 45 and 47, respectfully. If the signal given by equation (2) is multiplied by $2\cos(\Omega_0 k)$ and $-2\sin(\Omega_0 k)$, and the double frequency terms rejected by low-pass filtering, then the outputs of the low-pass filters are $$I[k] = A[k]\cos[\Delta\Omega k + \phi(k;\underline{a}) + \phi_1]$$

and $$Q[k] = A[k]\sin[\Delta\Omega k + \phi(k;\underline{a}) + \phi_1]; k=0, 1, 2, \ldots . \quad (3)$$

Equations (3) represents the desired I-Q signals.

The digital implementation of the I-Q mixing method illustrated in FIG. 5 has a significant advantage over a corresponding analog implementation in terms of the precise quadrature phase and amplitude balance that can be maintained. Precise balance of the quadrature signals is a critical requirement for this method.

Referring now also to FIG. 6, I-Q signal decomposition involves the utilization of a Hilbert transformer 51, delay line 49 and four mixers 53, 55, 57 and 59. This configuration approximates two single-sideband mixers that are in phase-quadrature. The advantage of this method over that shown in FIG. 5 is the elimination of the low-pass filters 45 and 47 which are not required because the double frequency terms are cancelled by the single-sideband mixers.

All three techniques described above will allow decimation of the I[k] and Q[k] samples by a factor of four or more to allow efficient processing of I[k] and Q[k]. An advantage of the low-pass filtering shown in FIG. 5 is a reduction in ADC quantization noise introduced by the digitizer 19.

After I[k] and Q[k] are produced, amplitude and phase functions are computed and output on lines 24 and 26, respectively. The amplitude function is given as $$A[k] = SQRT[I^2[k] + Q^2[k]]$$

$$k = 0, 1, 2, \ldots, K \quad (4)$$

and the phase function is given as $$\theta[k] = ARCTAN\{\phi a[k]/I[k]\}$$

$$k = 0, 1, 2, \ldots, K \quad (5)$$

K+1 is the number of samples in a burst, for example, if the duration of a burst is 0.5 milliseconds and the sampling rate is 2800 Ksps, then K=1400.

The phase samples given by equation (5) are passed through a differentiator to produce samples of the frequency versus time function. The differentiator 25 would preferably be an anti-symmetric FIR digital filter that has a linear magnitude response and a 90° phase shift over the range of frequencies of the test signal. Like the Hilbert transformer 31, the differentiator 25 is a well-known digital filter that is easily and accurately implemented in digital hardware.

Figure 7:
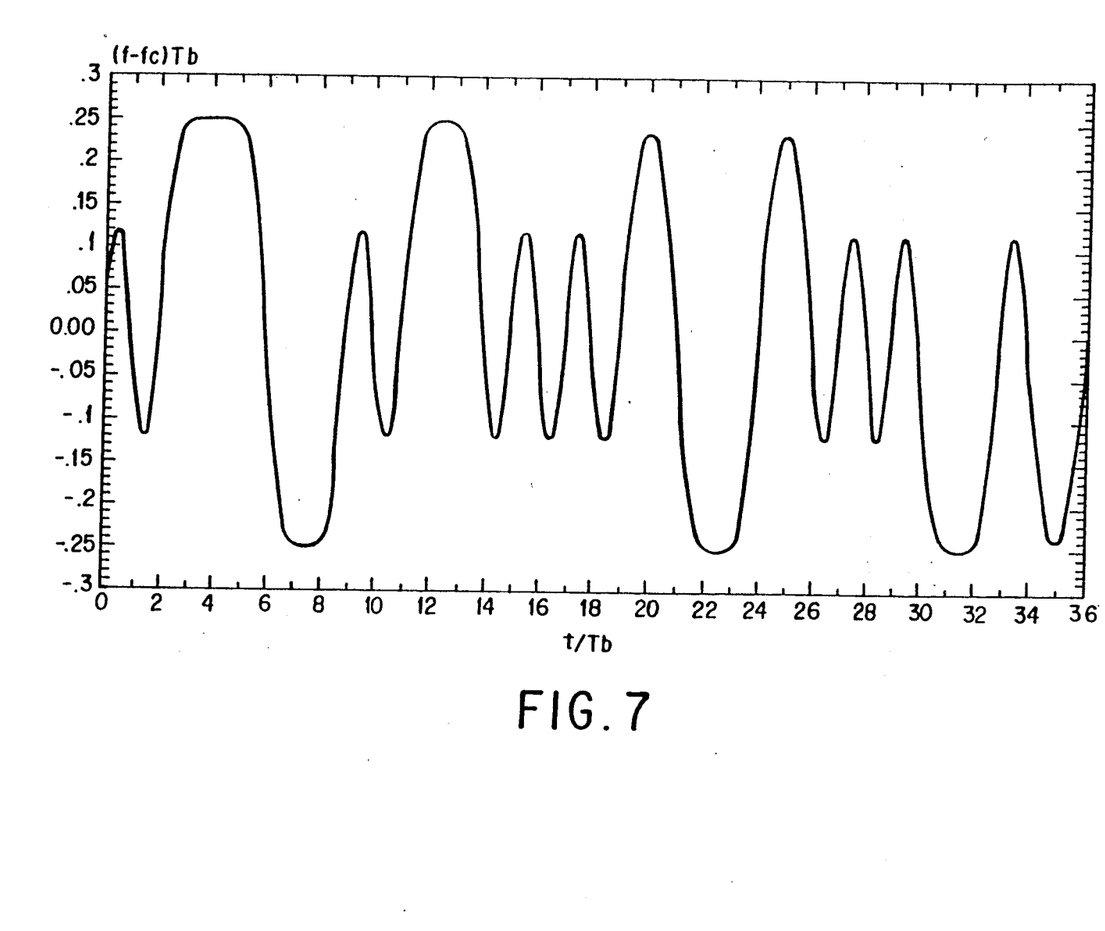
FIG. 7 is a frequency plot illustrating a typical frequency deviation function for an GMSK.3 modulated signal.
Figure 8:
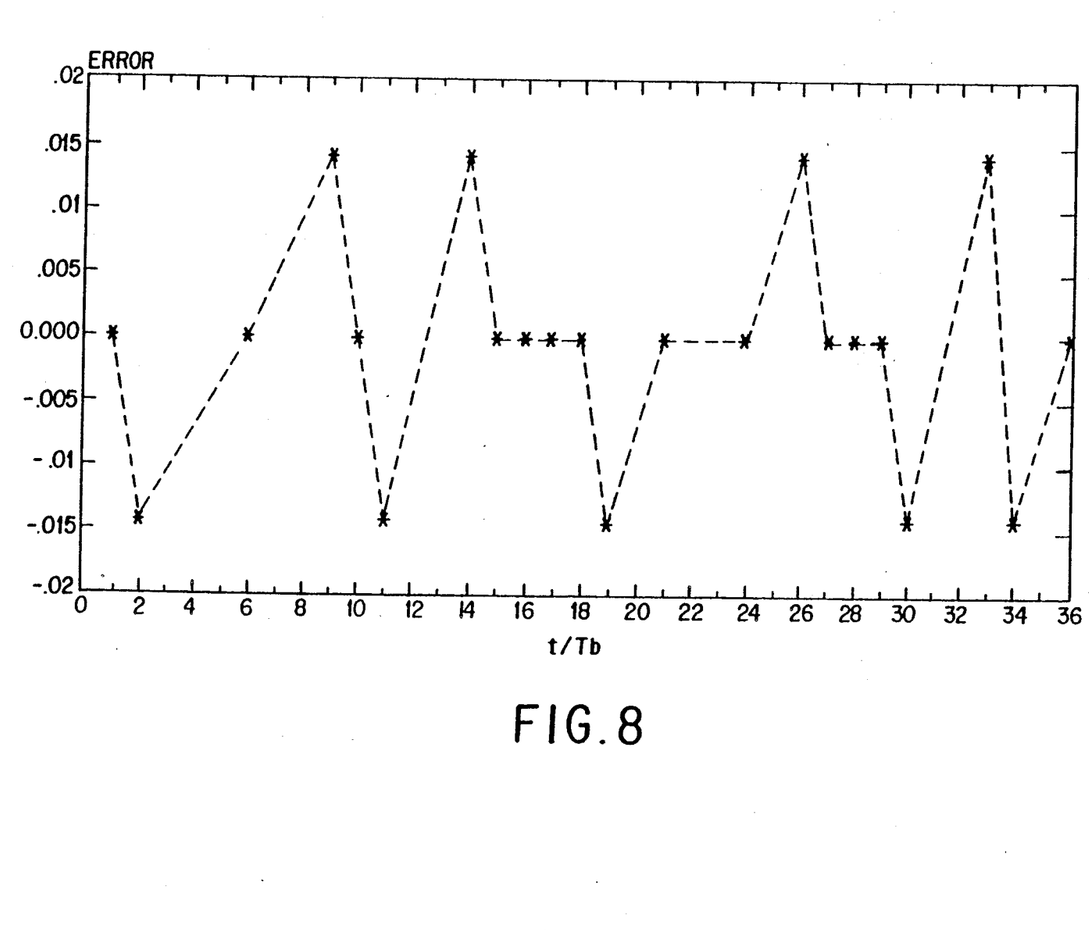
FIG. 8 is a plot illustrating the error in the detected zero crossings of the frequency deviation plot shown in FIG. 7.

Referring now also to FIGS. 7 and 8, a typical frequency deviation function for GMSK.3 modulation which is a modulation scheme proposed in Europe for digital mobile radios is shown. In FIG. 7, $(f-f_c)T_b$ is the frequency deviation from the signal carrier (IF) frequency, $f_c$, normalized by the bit rate $f_b = 1/T_b$ where $T_b$ is the bit interval. The frequency deviation is shown for 36 bits in FIG. 7. A positive value of frequency deviation over a bit interval represents one binary state and a negative value the other binary state. The frequency function shown in FIG. 7 represents the bit sequence $$101111000101110101011000110101000100 \quad (6)$$

or the complement of this sequence.

From FIG. 7, it can be seen that the frequency deviation passes through zero approximately at multiples of $T_b$ as shown in FIG. 8. From FIGS. 7 and 8, it can be seen that if the bit pattern is known, then errors in the zero-crossings from multiples of $T_b$ are predictable. For example, if bit 10 is followed by bit 11, then the zero-crossing between bit 10 an bit 11 will have an error of $-0.0142T_b$. The error in the zero-crossing between bit 00 and bit 10 will be $0.0142T_b$ and the error in zero-crossing between bit 11 and bit 00 will be approximately zero, etc.

The output of the differentiator 25 is not a continuous time function as shown in FIG. 7 but is actual samples (values) of the frequency function. For example, if the bit rate is 270 kbps and the sampling rate is 2.8 Msps, then there would be 10.37 samples per bit.

Referring again to FIG. 3, following the differentiator 25, the IF frequency is subtracted (block 27) from the frequency function to produce the frequency deviation function as presented in FIG. 7. The next step, block 29, is to detect the zero-crossing from which the received data sequence is detected as illustrated by bit sequence (6). Since discrete time samples of frequency deviation are available, the zero-crossings are detected using an interpolation algorithm. From the detected data sequence, a correction is made, block 31, to compensate for the difference in zero-crossings from multiples of $T_b$. These compensated zero-crossings provide the data used to establish a data clock synchronized to the transmitter (not shown) data clock.

In block 33, the period and phase of the transmitter data clock must be estimated very accurately to minimize errors in the measured phase error. For example, an error of 1 per cent in the data clock phase will result in a phase measurement error as large as 0.9 degrees which may not be acceptable. Even though measured zero-crossings are compensated, measurement noise may result in an unreliable data clock unless the data clock is estimated in an optimal manner. The transmitter data clock may be represented as $$t_k = kT + b, \quad k = 0, 1, 2, \ldots \tag{7}$$

where T is the transmitter data clock period and b is the unknown data clock phase. The a priori clock period T is known within a specified tolerance of T. The objective is to obtain estimates and of T and b from the measured zero-crossings.

Suppose $s_i$, $i = 1, 2, \ldots, N$ are the measured and compensated zero-crossings of the frequency deviation function. An estimate of the zero-crossings spaced by multiples of can be written as $$s_i = k_i T + b \tag{8}$$

where $$k_i = INT[(s_i - \epsilon_1)/T + 0.5] \tag{9}$$

and $\epsilon_1$ is a time reference which may be a zero-crossing near the center of the signal burst. Values of and are obtained such that the mean-square error between the sets $s_i$ and $_i$, $i = 1, 2, \ldots, N$ given by $$\epsilon^2 = \frac{1}{N} \sum_{i=1}^{N} (s_i - k_i T - b)^2 \tag{10}$$

is minimized. The resulting estimates are $$T = \frac{\sum_{i=1}^{N} k_i s_i - \frac{1}{N}\left(\sum_{i=1}^{N} s_i\right)\left(\sum_{i=1}^{N} k_i\right)}{\sum_{i=1}^{N} k_i^2 - \frac{1}{N}\left(\sum_{i=1}^{N} k_i\right)^2} \tag{11}$$

and $$b = \frac{1}{N}\left[\sum_{i=1}^{N} s_i - T \sum_{i=1}^{N} k_i\right] \tag{12}$$

The receiver data clock synchronized to the transmitter data clock is given as $$t_k = kT + b, \quad k + 0, 1, 2, \ldots \tag{13}$$

If the clock period T is known a priori with sufficient accuracy for the required measurement, or it is required that the measurement include the measurement of phase errors attributable to inaccuracies in T, T would not be estimated. In this case $= T$ in equations (12) and (13) and only the data clock phase is estimated as given by equation (12). The next step, block 35, is to synchronize bit patterns to establish the active time interval of a signal burst over which the phase and amplitude errors are determined and displayed. If a synchronizing pattern such as a preamble or midamble is available, i.e., included in the transmitted signal burst, then the leading and trailing edges of the envelope of the burst obtained from A[k] as given by equation (4) are used to establish the range over which the preamble or midamble may exist. A discrete-time cross-correlation of the detected bit pattern with the known synchronizing pattern is performed to align the two patterns and establish the active interval. If a synchronizing pattern does not exist, then the active interval of the test is centered between the leading and trailing edges of the envelope of the burst.

Knowledge of the clock phase and period, the data sequence and the time interval of interest provide the information needed to mathematically compute the ideal amplitude and phase modulating functions A[k] and $\phi[k; \underline{a}]$. These computed functions are then compared at block 38 with the corresponding measured values of amplitude and phase to obtain measurements of amplitude and phase errors.

By way of example, synthesis, block 37, of the phase function for continuous-phase-modulated signals (CPM) will be considered here.

The phase function for CPM can be written as $$\phi(t; \underline{a}) = 2\pi \sum_{i=-\infty}^{\infty} h_i a_i q(t - i T_b) \tag{14}$$

where $$\underline{a} = (\ldots, a_{-1}, a_0, a_1, a_2, \ldots)$$

with $a_i = \pm 1, \pm 3, \ldots, \pm(2M-1)$
is the data sequence. For binary modulation $M = 1$ and $$a_i = \pm 1.$$

Figure 9A:
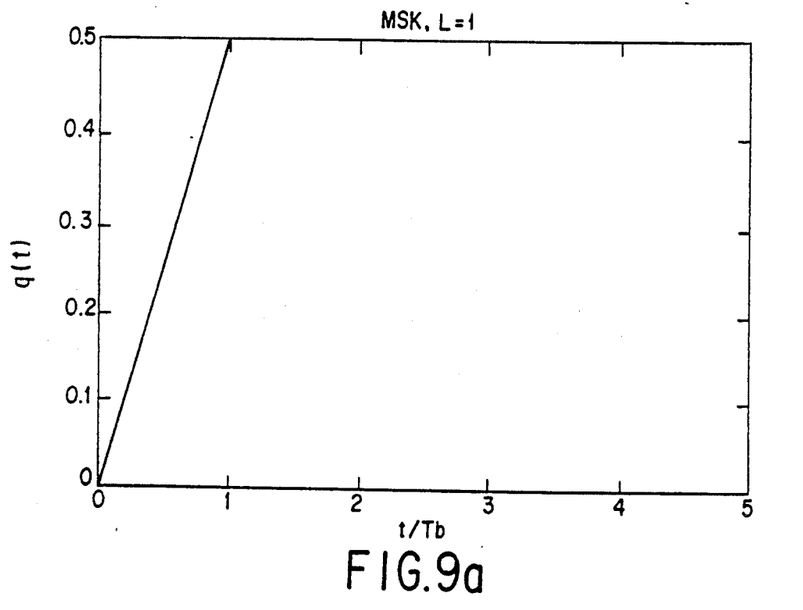
FIG. 9a is a plot showing the phase pulse response for minimum shift-key modulation.
Figure 9B:
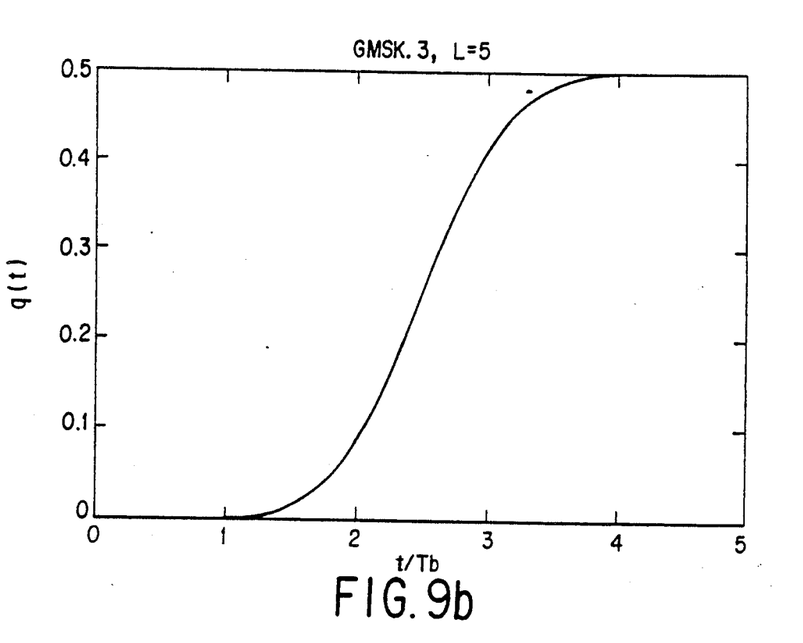
FIG. 9b is a plot showing the phase pulse response for Gaussian minimum shift-key modulation.

$h_i$ is the modulation index which in general may be a cyclic function of time. For many common modulations such as minimum shift-key (MSK) and Gaussian minimum shift-key (GMSK), $h = \frac{1}{2}$ (constant). $q(t)$ is the phase pulse-shape function which has the property that $$\begin{align} q(t) &= 0, \quad t < 0 \\ &= \tfrac{1}{2}, \quad t > L T_b \end{align} \tag{15}$$

where L is a positive integer. The type of modulation is determined by q(t). Phase pulse response curves for MSK and GMSK.3, L=5 are plotted in FIGS. 9a and 9b, respectively.

After the ideal phase function $\phi[k; \underline{a}]$ is synthesized, it is subtracted from the measurement phase function $$\Theta[k] = \Delta\Omega k + \phi[k; \underline{a}] + \phi_1 \tag{16}$$

to produce the phase difference given as $$\begin{align} \theta_\phi[k] &= \theta[k] - \phi[k; a] \\ &= \Delta\Omega k + \phi[k; a] - \phi[k; a] + \phi_1 \end{align} \tag{17}$$

The phase error is defined as $$\epsilon_\phi[k] = \phi[k; a] - \phi[k; a] \tag{18}$$

i.e. the difference between the received and synthesized ideal phase functions, so that the phase difference is $$\Theta_\phi[k] = \Delta\Omega k + \epsilon_\phi[k] + \phi_1$$

$$k = 1, 2, \ldots, K \tag{19}$$

where $\Delta\Omega$ is the frequency error and $\phi_1$ is the unknown offset phase.

The phase difference $\Theta_\phi[k]$, has a linear term $\Delta\Omega k$ with slope $\Delta\Omega Q$ and a constant term $\phi_1$, that can be estimated by fitting the K values given by equation (19) to a linear regression curve $$\Theta_\phi[k] = \Delta\Omega k + \phi_1 \qquad (20)$$

The difference between equations (19) and (20) given as $$\epsilon_\phi[k] = \epsilon_\phi[k] + (\Delta\Omega - \Delta\Omega)k + (\phi_1 - \phi_1)$$

$$k = 1, 2, \ldots, K \qquad (21)$$

along with statistics of $\epsilon_\phi[k]$ is the desired output of the method.

Referring now also to FIGS. 10, 11, 12, 13 and 14, the phase error and other information determined by the above described method is plotted. In FIG. 10, the measured phase difference on a bit-by-bit basis is plotted versus time as curve 103. Curve 103 shows the difference in phase between the ideal phase function and the transmitted phase function for each data bit in a signal burst. Curve 101 is the linear regression of the phase difference plotted versus the data bit number for a data burst. The slope of the linear regression curve 101 represents the frequency error of the transmitted signal. In FIG. 11, curve 111 is a plot of the instantaneous phase error versus time (bit number) for the data bits in a signal burst and represents the instantaneous phase error of the transmitted signal when compared to the ideal signal. FIGS. 12, 13 and 14 are a plot of the measured signal amplitude versus bit number for a signal burst. Curve 121 is the amplitude of the signal burst. Curves 123 and 125 are the upper and lower bounds allowed for the amplitude. Curve 127 is an expanded plot of the rise time of the transmitted signal amplitude and curve 129 is an expanded plot of the fall time of the transmitted amplitude.

We claim:

1. A method for determining the phase error in a modulated RF signal generated by a transmitter comprising the steps of:
    transforming said modulated RF signal into its component in-phase and quadrature-phase signals;
    calculating a phase function and an amplitude function corresponding to said modulated RF signal utilizing said component in-phase and quadrature-phase signals;
    differentiating said phase function to provide a frequency function corresponding to said modulated RF signals;
    subtracting the frequency of said modulated RF signal from said frequency function to provide a frequency deviation function corresponding to said modulated RF signal;
    detecting the zero-crossing of said frequency deviation function;
    detecting a data sequence from said detected, zero crossings, said data sequence representative of a data sequence contained in said modulated RF signal;
    compensating said detected zero-crossings in response to said detected data sequence for correcting errors in said detected zero crossings when compared to integral multiples of a data bit interval, said data bit interval value being known within a predetermined tolerance;
    estimating the period and phase of said transmitter data clock signal from said compensated zero crossings;
    synchronizing said detected data bit sequence with said estimated transmitter data clock signal for establishing an active measurement interval;
    calculating a theoretical ideal phase function corresponding to said modulated RF signal; and
    comparing said theoretical ideal phase function to said phase function to determine the phase difference function of said modulated RF signal.

2. The method of claim 1 further comprising the step of performing a linear regression on said phase difference function to determine the frequency error of said modulated RF signal.

3. The method of claim 1 further comprising the step of mixing said modulated RF signal with a local oscillator signal to provide a modulated intermediate frequency signal having a predetermined frequency.

4. The method of claim 3 further comprising the step of digitizing said modulated intermediate frequency signal to provide a sequence of discrete time samples of said intermediate frequency signal.

5. The method of claim 4 further comprising the step of filtering said digitized intermediate frequency signal to remove undesirable harmonics of said predetermined intermediate frequency.

6. The method of claim 1 further comprising the step of comparing said amplitude function to a predetermined set of allowable upper and lower boundary values.

7. A method for determining the phase error in a modulated RF signal generated by a transmitter, said modulated RF signal including a bit sequence representing data, comprising the steps of:
    transforming said modulated RF signal into its component in-phase and quadrature-phase signals;
    calculating a phase function and an amplitude function corresponding to said modulated RF signal utilizing said component in-phase and quadrature-phase signals;
    synchronizing said data bit sequence with a known bit sequence for providing a transmitter data clock signal and a data bit sequence interval signal;
    detecting said data bit sequence;
    calculating a theoretical ideal phase function utilizing said data bit sequence interval signal, said transmitter data clock signal and said data bit sequence, said ideal phase function corresponding to said modulated RF signal; and
    comparing said theoretical ideal phase function to said phase function to determine the phase difference function of said modulated RF signal.

8. The method of claim 7 further comprising the step of performing a linear regression on said phase difference function to determine the frequency error of said modulated RF signal.

9. The method of claim 7 further comprising the step of mixing said modulated RF signal with a local oscillator signal to provide a modulated intermediate frequency signal having a predetermined frequency.

10. The method of claim 9 further comprising the step of digitizing said modulated intermediate frequency signal to provide a sequence of discrete time samples of said intermediate frequency signal.

11. The method of claim 10 further comprising the step of filtering said digitized intermediate frequency signal to remove undesirable harmonics of said predetermined intermediate frequency.

12. The method of claim 7 wherein the step of detecting the data comprises the implementation of a Viberti algorithm.

13. Apparatus for determining the phase error in a modulated RF signal generated by a transmitter comprising;
receiver means for receiving said modulated RF signal;
digitizer means coupled to said receiver means for converting said modulated RF signal to a digital signal; and
digital signal processor means for processing said digital signal to provide a phase function signal, a transmitter data clock signal, a data interval signal and a data bit sequence, said digital signal processor means utilizing said transmitter data clock signal, said data interval signal and said data bit sequence to calculate and synthesize an ideal phase function signal corresponding to said modulated RF signal, said digital signal processor comparing said phase function signal with said ideal phase function signal to provide a phase difference signal representative of the phase difference between said phase function signal and said ideal phase function signal.

14. Apparatus as in claim 13 wherein said receiver means comprises
local oscillator means for generating a local oscillator signal;
mixer means coupled to said local oscillator and responsive to said modulated RF signal and said local oscillator signal for providing an intermediate frequency signal having a predetermined frequency; and
filter means coupled to said mixer means for removing RF signal and local oscillator signal feedthrough and spurious noise signals from said intermediate frequency signal.

15. Apparatus as in claim 14 wherein said digitizer means comprises an analog-to-digital converter sampling said intermediate frequency at a predetermined sampling rate.

16. Apparatus as in claim 15 wherein said digital signal processor means includes means for transforming said digital intermediate frequency signal into component in-phase and quadrature phase signals.

17. Apparatus as in claim 16 wherein said digital signal processor means further includes means for calculating an amplitude function signal and a phase function signal utilizing said in-phase and quadrature-phase signals, said amplitude function and phase function signals corresponding to said modulated RF signal.

18. Apparatus as in claim 13 further comprising display means for displaying said phase difference signal.

* * * * *